United States Patent [19]

Multani et al.

[11] 4,243,937
[45] Jan. 6, 1981

[54] MICROELECTRONIC DEVICE AND METHOD FOR TESTING SAME

[75] Inventors: Jagir S. Multani; Jagtar S. Sandhu, both of Dix Hills, N.Y.

[73] Assignee: General Instrument Corporation, New York, N.Y.

[21] Appl. No.: 27,842

[22] Filed: Apr. 6, 1979

[51] Int. Cl.³ .......................................... G01R 31/22
[52] U.S. Cl. ................................ 324/158 T; 29/574; 324/73 PC; 371/21; 371/25
[58] Field of Search ............. 324/158 J, 73 PC, 73 R, 324/62; 371/21, 25; 29/574

[56] References Cited

U.S. PATENT DOCUMENTS

| | | | |
|---|---|---|---|
| 3,723,873 | 3/1973 | Witteles | 324/158 T |
| 3,815,025 | 6/1974 | Jordan | 324/73 R |
| 3,821,645 | 6/1974 | Vinsani | 371/25 X |
| 3,889,188 | 6/1975 | Trindade | 324/158 T |
| 4,150,331 | 4/1979 | Lacher | 324/73 PC |
| 4,168,432 | 9/1979 | Williams et al. | 324/158 T X |
| 4,176,258 | 11/1979 | Jackson | 324/73 R X |

FOREIGN PATENT DOCUMENTS 1469486 4/1977 United Kingdom.

Primary Examiner—Stanley T. Krawczewicz
Attorney, Agent, or Firm—Barry R. Lipsitz

[57] ABSTRACT

A method for testing a microelectronic circuit to detect process defects which affect first and second characteristics of the circuit elements thereof. The circuit is formed on a semiconductor chip in proximity with an independent test element. The test element is not connected to and does not form a part of the circuit. The circuit elements are tested to detect process defects which affect the first characteristic thereof. The test element is tested to detect process defects which affect the second characteristics of both the circuit elements and the test element. The results of the test on the test element are relied on to determine the acceptability of the second characteristics of the circuit elements. The test on the test element for said second characteristic may be performed at the same time the circuit elements are being tested for said first characteristic.

10 Claims, 3 Drawing Figures

MICROELECTRONIC DEVICE AND METHOD FOR TESTING SAME

The present invention relates to the testing of transistors and more particularly to a method for measuring the memory retention and endurance properties of Electrically Alterable Read Only Memory (EAROM) transistors.

The EAROM is a non-volatile (i.e., retains data even when no power is applied) semiconductor memory which differs from a conventional Read Only Memory (ROM) in that the data pattern in the EAROM is alterable. Both Programmable Read Only Memories (PROM) and Electrically Programmable Read Only Memories (EPROM) have been developed to provide non-volatile storage. Each permits information to be written and maintained in them at the user's discretion, but these devices have limitations. Information can be introduced into a PROM only a singal time because fusable links are permanently opened when they are programmed. Thus, once the PROM is programmed, the pattern is permanently set in the memory and the device performs like an ordinary ROM. In the case of an EPROM, an ultraviolet light is used to erase the entire contents of the memory and writing is done with special apparatus. Thus, the EPROM must be physically removed from the equipment of which it forms a part before it can be reprogrammed. An EAROM is not subject to either of the above-mentioned limitations. An EAROM can be erased and rewritten many times, by electronic signals from the equipment it is used in, and any portion of the memory may be altered without disturbing the data contained in the remainder of the memory.

A common method of manufacturing microelectronic devices such as EAROMs involves the production of relatively large semiconductor wafers which contain many semiconductor "chips". Generally, each chip on the wafer is structurally identical to every other chip on that wafer and each chip comprises a complete integrated circuit which performs a particular function in the end product (e.g., calculator, television, sewing machine) in which it will ultimately be used. The chips on each wafer are processed into individual circuit components by scribing the wafer around each chip, severing the chips from one another, and packaging each chip in its own plastic, ceramic, or metal carrier. Since some uncertainty is involved in present day semiconductor manufacturing techniques, it is important that the semiconductor wafers, and in particular the chips which have been formed on the wafers, be adequately tested for electrical functionality and reliability before the final manufacturing operations are performed. One such test which is performed on memory circuit chips is that of memory retention and endurance. Retention is the ability of a memory transistor to store data in a manner which permits subsequent reading thereof. Endurance is the ability of the device to withstand repeated write/erase pulses of alternating polarity without degradation in its memory (e.g., retention) properties. Functionality tests are those tests which determine if the chips's circuitry is properly performing its basic functions such as reading, writing and erasing data.

In the past, memory retention and endurance tests on the one hand and functionality tests on the other hand have been performed on EAROM chips as separate operations during wafer probing (i.e., final testing of the wafer before it is separated into the individual chips). Retention testing and functionality testing each require the writing of a separate checkerboard pattern (alternating "ones" and "zeros") into the memory. For each of the tests, manipulation of the data through the memory in this pattern enables each and every memory transistor, or "bit", to be tested. However, since the checkerboard pattern tests require every bit in the memory, the functionality tests cannot be performed at the same time as the memory retention tests; the tests must be performed in sequence. For example, the functionality tests would first be performed, using each and every bit within the memory. When the functionality tests were completed, the bits would all be cleared and then the memory retention tests would commence, again using each and every bit within the memory. Since each test requires all the memory transistors or bits, both functionality and memory retention testing of the same memory chip at the same time is not possible. Two separate testing periods during wafer probing are therefore required, one period for functionality testing and a second period for retention testing.

In the method of the present invention, a separate memory test transistor is used to accomplish memory retention and endurance testing simultaneously with functionality tests which are run on the transistors comprising the actual memory. As used herein, the term "simultaneously" is meant to describe events which share some common time period but the term is not meant to be limited to events which begin at the same point in time, end at the same point in time, or have the same duration. The functionality and the memory retention and endurance tests are of substantially the same time duration so that a chip can be probed for both purposes in the same time period. Therefore, each and every EAROM circuit on the wafer can be probed for retention and endurance without any extra investment in testing time over that required for the functionality testing alone. This is theoretically possible because the retention and endurance properties of all memory transistors in the same general area on the wafer are usually similar. Thus, even though every transistor in the memory must be separately checked for functionality, the retention and endurance characteristics of just one representative test transistor per chip can be relied upon to reflect the retention and endurance characteristics of all the other memory transistors located on that chip.

It is, therefore, a prime object of the present invention to provide a method for testing the reliability of semiconductor memory devices during routine wafer probing in a manner which reduces the time requirements to those normally required for functional testing alone.

It is another object of the present invention to provide a method for screening bad EAROM integrated circuit chips from good ones on the basis of their reliability wherein a memory test transistor is relied on to predict the retention and endurance properties of the chip.

In accordance with the present invention, a method is provided for determining first and second characteristics of a microelectronic circuit of the type having main circuit elements and an additional circuit element substantially identical to the main circuit elements. The main circuit elements are tested for the first characteristic. The additional circuit element is tested for the second characteristic. The second characteristic of the additional circuit element is relied on to be representative of the second characteristic of the main circuit elements.

More particularly, a method is provided for screening EAROM circuit chips on the basis of their retention and endurance properties (reliability). The screening may be done at the wafer probing stage of manufacturing the integrated circuits and can be accomplished simultaneously with the functional test of the circuits. Circuit chips failing either the reliability screening or the functional testing are noted (e.g., marked with an ink spot) and rejected when separated from the wafer.

Each of the circuit chips is provided with a separate test memory transistor which is substantially identical to the transistors used in the chip's actual memory array and thus has characteristics which are representative of those in the memory array. This memory transistor is subjected to repeated write/erase cycling for a predetermined number of cycles and the rate of decay of the transistor's threshold voltage is then measured. If the rate of decay is within an acceptable range, the chip is considered to have acceptable retention and endurance properties. If the rate of decay is outside the acceptable range, the chip is rejected.

The foregoing and other features and advantages of the invention will be apparent from the following more particular description of a preferred embodiment of the invention discussed below in conjunction with the accompanying drawings in which.

Figure 1:
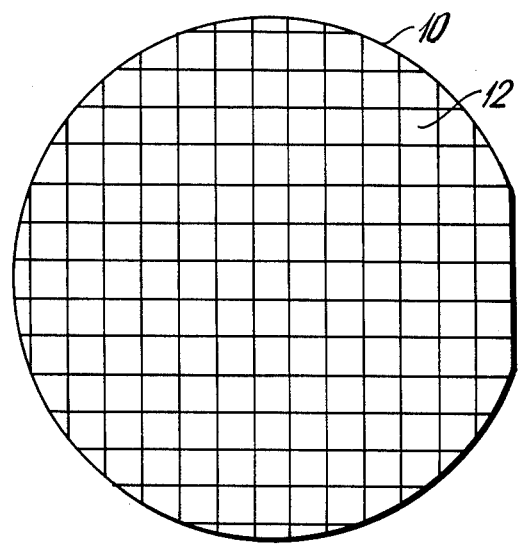
FIG. 1 is a plan view of a plurality of chips formed on a wafer.
Figure 2:
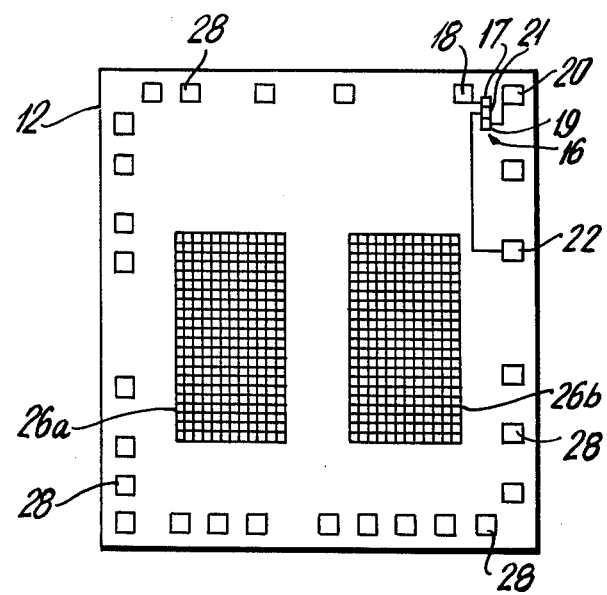
FIG. 2 is a plan view of one chip containing functional circuitry and a separate test transistor.

Referring now to FIG. 1, a wafer 10 is shown which contains a plurality of chips 12. It is desirable from a manufacturing standpoint to test all the chips on the wafer before the wafer is broken apart into the plurality of individual chips it comprises. A diagrammatical representation of a single EAROM chip 12 is shown in FIG. 2. The chip contains two sections of memory array designated as 26a and 26b. The drain 17, gate 19 and source 21 of a memory test transistor 16 are connected to contact pads 18, 20 and 22 respectively. Contact pad 22 is also connected to the substrate of the chip. A plurality of pads 28 are provided to enable the connection of other circuitry within the chip (not shown) to other chips or circuits external to the chip.

The basic element of an EAROM is a transistor which exhibits the characteristic of being able to store charge to thereby vary the transistor's threshold voltage (i.e., the voltage required at the transistor's control electrode to render the transistor conductive). A plurality of such transistors may be arranged in an array and coupled to an addressing means to create a non-volatile, electrically alterable memory. One may merely change the threshold voltage of the transistor to either a high value or a low value depending on whether a binary "1" or a binary "0" binary digit (bit) is to be stored. To read the bit thereafter, it is necessary to apply a voltage to the control electrode which is between the high and low threshold voltages. If the transistor conducts, a bit of one value is being read and if the device does not conduct, a bit of the other value is being read.

One type of transistor which has been used as the memory element in EAROM chips is the p-channel Metal-Nitride-Oxide Semiconductor (MNOS). In order to change the threshold voltage of a p-channel MNOS transistor to a high value, the transistor is "written" into the low-conduction state by the application of a negative voltage (typically 25–30 volts) to the transistor's control electrode. Since the transistor has been written into a low-conduction state, a relatively high value of voltage, known to those skilled in the art as the "write threshold" or "written threshold", will subsequently be required at the transistor's control electrode to render the transistor conductive.

The transistor can also be "erased" into a high-conduction state (low threshold) by the application of a large positive voltage to the control electrode. The voltage subsequently required at the transistor's control electrode to render it conductive is known as the "erase threshold" or "erased threshold" and for a p-channel MNOS transistor is lower than the write threshold.

An inherent property of EAROM devices is that the threshold voltages of the memory transistors tend to decay with time. More particularly, for a p-channel device the erase threshold will increase with time and the written threshold will decrease with time. Thus, the difference between these two thresholds, commonly referred to as the "memory window", becomes smaller with the passage of time. This makes it more and more difficult to read the state of the memory transistor because the voltage difference between a one and a zero becomes smaller and thus harder to distinguish.

The ability of a memory transistor to retain data entered into it and to be capable of being read is known as its retention property. Endurance is defined as the ability of the device to withstand repeated write/erase pulses of alternating polarity without changes in either the memory window or the rate of memory threshold decay beyond a definite limit. Thus, endurance and retention are different ways to determine the same quality; namely, the reliability of the EAROM circuit.

One object in the manufacture of alterable, non-volatile semiconductor memories such as EAROMs is to produce a device which will retain its data for a significant period of time, for example, ten years. In order to accomplish this, methods are required to test the memory circuits and predict their reliability on an individual basis before they are packaged and sold to their ultimate users. It has been discovered that the erase threshold voltage increases with write/erase cycling in p-channel EAROM devices of marginal or substandard quality. Similarly, the write threshold voltage decreases with write/erase cycling of bad devices. This effect levels off after several thousand cycles of a given memory transistor, and can be used to predict memory reliability. The magnitude of the change in threshold voltage depends on the quality of the memory transistor, and can be negligible or substantial.

The present invention takes advantage of this correlation between the quality of a memory transistor and its endurance when subjected to repeated write and erase pulses. In one preferred embodiment, a test transistor 16, separate from but physically identical to those in the memory arrays 26a and 26b, is provided on each circuit chip formed on a wafer. Metal lines from the drain 17, the gate 19 and the source and substrate 21 are brought out to pads 18, 20 and 22 on the periphery of the chip containing the EAROM circuit. These pads can be used to accommodate probes carrying signals to and from a computer controlled test station.

In the method of the present invention the gate 19 of memory transistor 16 is pulsed with pulses of alternating opposite polarity for, typically, 100 to 1000 write/erase cycles. The pulse train used to pulse the gate may alternate between +25 volts and −25 volts with a pulse width of 5 milliseconds and the time between successive alternating pulses may be on the order of 10 microseconds. In practice, other combinations of sufficient voltages and times for writing and erasing can be used. Neither the time nor the pulse voltages have to be of the same magnitude for writing and erasing.

During the write/erase cycling of memory transistor 16, the drain 17, and the source and substrate 21 are kept grounded. After the write/erase cycling has been completed, the decay of the threshold voltage, for example the written threshold, is measured as a function of decay time. One way to do this is to apply a varying voltage, for example a voltage ramp, to the gate 19, and drain 17 of the transistor with the source and substrate 21 grounded, and to monitor the drain to source current. When a predetermined value of drain to source current is detected, indicating that the transistor has changed state (e.g., changed from a nonconductive to a conductive condition), the gate voltage is measured and noted. This gate voltage is the threshold voltage of the device. A predetermined amount of time is then allowed to elapse. Other functional testing, for example on the circuits contained within memory arrays 26a and 26b, can be continued during this time delay. The threshold voltage of the device is then measured again at the same value of drain to source to current used previously and this second measurement is compared to the first measurement. If the change in the measured threshold voltage is within an acceptable range the retention and endurance properties of the memory are considered good. If the change is outside the acceptable range, the memory under test is rejected. For an EAROM such as the ER 1400 manufactured by General Instrument Corporation, a threshold decay of less than 0.40 volts per decade in time is considered acceptable after 1000 write/erase cycles.

Figure 3:
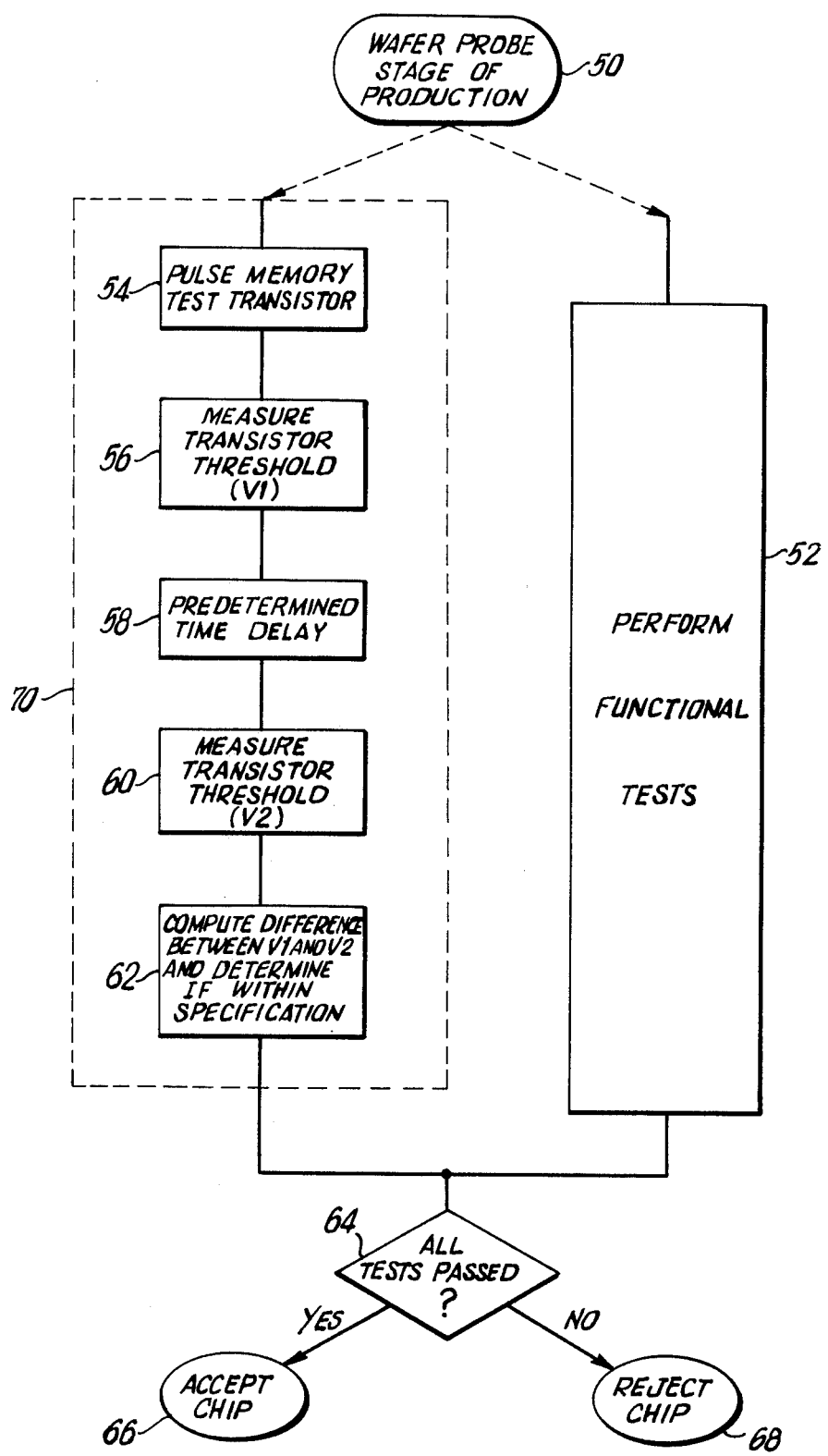
FIG. 3 is a flowchart showing the steps of the method of the present invention.

The method described above is shown in block diagram form in FIG. 3. Each chip on the wafer may be successively tested during wafer probing 50. Functional tests 52 are performed concurrently with retention/endurance testing 70 of the memory test transistor. As step 54 the memory test transistor is pulsed with alternating polarity pulses. The transistor's threshold voltage is measured at step 56 and noted (V1). A predetermined time delay occurs at step 58. The transistor's threshold voltage is then measured again at step 60 and noted (V2). At step 62 the difference between the first threshold voltage measurement (V1) and the second threshold voltage measurement (V2) is computed. Based on the results of the concurrently run functional tests and retention/endurance test, a decision is made at step 64 as to whether the tested chip should be accepted (all tests passed) or rejected (any test failed).

The method of the present invention has been found to be reliable in practice and a direct correlation of the behavior of the test transistor with the behavior of the EAROM circuit has been demonstrated. This result occurs because the process variations across a completed wafer are generally localized. Therefore, if a test transistor located within the same general area of the wafer as its corresponding memory circuit is found to have acceptable retention and endurance properties, the probability is extremely high that all of the similar transistors in the memory circuit will be acceptable. Similarly, if a test transistor is bad, the process variation responsible is most likely present in other memory transistors in the same general area on the wafer.

The method of this invention allows each and every circuit on a wafer to be tested for reliability simultaneously with the testing of the circuit's functionality. The method is applicable to any EAROM circuit and is independent of the circuit operation for any given chip type.

As the reader can now appreciate, a method has been disclosed which provides for the testing of the reliability of semiconductor memory devices during routine wafer probing and without any time investment in excess of that required for functional testing.

While only a single embodiment has been described herein for purposes of illustration, many variations and modifications could be made thereto. It is intended to cover all of these variations and modifications which fall within the scope of the present invention, as recited in the following claims

We claim:

1. A method for determining first and second distinct characteristics of a microelectronic circuit, the circuit being of the type which comprises circuit elements and is formed in proximity with an independent test element having a second characteristic representative of the second characteristic of said circuit elements, the method comprising the steps of:
 (a) testing at least one of said circuit elements for said first characteristic; and simultaneously
 (b) testing said test element for said second characteristic,
whereby said second characteristic of said test element is relied on to represent said second characteristic of said circuit elements.

2. The method of claim 1 wherein said steps are performed during the wafer probing stage of microelectronic circuit manufacture.

3. The method of claim 1 wherein said microelectronic circuit comprises an electrically alterable memory.

4. The method of claim 3 wherein said independent test element is a transistor.

5. The method of claim 4 wherein said second characteristic is the data retention capability of the electrically alterable memory.

6. The method of claim 4 wherein said second characteristic is the endurance of the electrically alterable memory.

7. The method of claim 5 or 6 wherein the step of testing said transistor for said second characteristic comprises cycling said transistor through a predetermined number of write/erase cycles and determining, subsequent to said cycling, the threshold voltage variation of the transistor as a function of time.

8. A method for testing the functionality and the data retention and endurance properties of an electrically alterable memory circuit, the circuit being of the type which comprises circuit elements and is formed in proximity with an independent test element, said test element having data retention and endurance properties representative of the data retention and endurance properties of said circuit elements, the method comprising the steps of:
 (a) testing said circuit elements for functionality; and simultaneously
 (b) testing said test element for its data retention and endurance properties, whereby the data retention and endurance properties of said test element are relied on to represent the data retention and endurance properties of said circuit elements.

9. In combination with a microelectronic circuit of the type having a plurality of circuit elements the improvement which comprises means for appraising a first characteristic of said circuit elements while the circuit elements are simultaneously being tested to determine a second characteristic.

10. The device of claim 9 wherein said means comprises an independent test element which is substantially identical to the circuit elements being tested.

* * * * *